(12) United States Patent
Arnhold et al.

(10) Patent No.: US 11,569,642 B2
(45) Date of Patent: Jan. 31, 2023

(54) HOUSING HAVING CAST PRESSURE RELIEF MEANS

(71) Applicant: R. STAHL Schaltgeräte GmbH, Waldenburg (DE)

(72) Inventors: Thorsten Arnhold, Pfedelbach (DE); Clife Hermanowski, Seckach (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 420 days.

(21) Appl. No.: 16/617,138

(22) PCT Filed: May 18, 2018

(86) PCT No.: PCT/EP2018/063152
§ 371 (c)(1),
(2) Date: Nov. 26, 2019

(87) PCT Pub. No.: WO2018/219696
PCT Pub. Date: Dec. 6, 2018

(65) Prior Publication Data
US 2021/0143617 A1    May 13, 2021

(30) Foreign Application Priority Data
Jun. 1, 2017  (DE) .......................... 102017112147.1

(51) Int. Cl.
*F16M 11/00*   (2006.01)
*H02B 1/28*    (2006.01)
(Continued)

(52) U.S. Cl.
CPC ............... *H02B 1/28* (2013.01); *H02K 5/136* (2013.01); *H05K 5/0213* (2013.01)

(58) Field of Classification Search
CPC ......... H02K 5/136; H05K 5/0213; H02B 1/28
See application file for complete search history.

(56) References Cited

U.S. PATENT DOCUMENTS

| | | | |
|---|---|---|---|
| 2005/0214111 A1* | 9/2005 | Dierker | ..................... F01D 9/06 415/169.1 |
| 2013/0206759 A1* | 8/2013 | Wurz | ...................... A62C 3/00 220/88.2 |

(Continued)

FOREIGN PATENT DOCUMENTS

| | | |
|---|---|---|
| AT | 414121 B | 9/2006 |
| AT | 424151 B | 3/2009 |

(Continued)

*Primary Examiner* — Amy J. Sterling
(74) *Attorney, Agent, or Firm* — Leydig, Voit & Mayer, Ltd.

(57) ABSTRACT

An explosion-proof housing 10 having at least one pressure relief body 15 arranged in a pressure compensation vent opening 14 of one of the housing parts 12, 13. In order to secure the pressure relief body 15 to the housing part 12, a thickened region 20 of the housing part 12 engages over an edge zone 24 of the pressure relief body 15 along its entire peripheral surface 23 on both of its flat sides 16, 17. A resulting engaging depth Si, which is measured parallel to the flat sides 16, 17, is preferably greater than a thickness D1, D2 of the part of the thickened region 20 engaging over the edge zone 24. The pressure relief element 15 consists of sintered wire mesh. This connection is pressure-resistant and stable over a wide temperature range.

11 Claims, 3 Drawing Sheets

(51) Int. Cl.
*H02K 5/136* (2006.01)
*H05K 5/02* (2006.01)

(56) References Cited

U.S. PATENT DOCUMENTS

2015/0053279 A1 2/2015 Farwell et al.
2018/0249600 A1* 8/2018 Coppola .............. H05K 9/0041

FOREIGN PATENT DOCUMENTS

| CN | 201478727 U | 5/2010 |
| CN | 103974604 A | 8/2014 |
| CN | 104421469 A | 3/2015 |
| CN | 104427808 A | 3/2015 |
| EP | 2842609 A2 | 3/2015 |
| RU | 2305883 C2 | 9/2007 |
| RU | 2552901 C1 | 6/2015 |

* cited by examiner

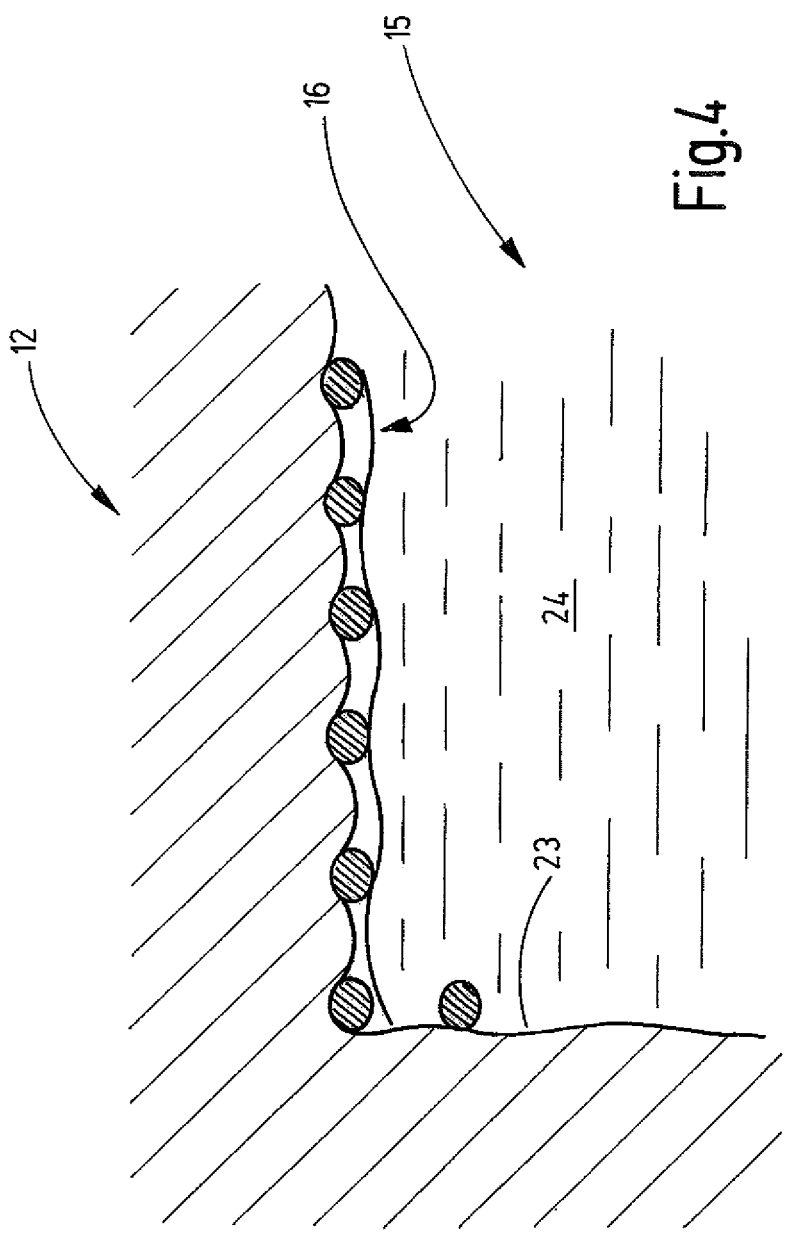
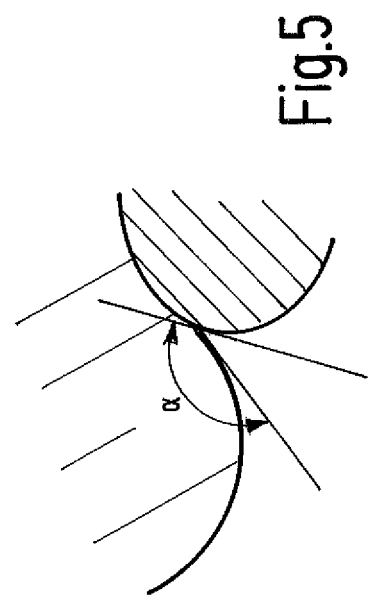

HOUSING HAVING CAST PRESSURE RELIEF MEANS

FIELD OF THE INVENTION

The present invention relates generally to cast housings, and more particularly to metal cast housings having at least one pressure relief flame filter body.

BACKGROUND OF THE INVENTION

Explosion-proof housings with pressure relief devices are known for explosion protection contaminant.

Publication DE 10 2013 109 259 A1 describes a housing with a porous flame filter body that is inserted into a receptacle part of the housing. The receptacle part may be a housing wall or a housing wall section of the explosion-proof housing. The peripheral zone of the porous body is connected to the receptacle part 25 in a positive-locking and/or material-bonding manner. The positive connection results from the penetration of the cast material into the pores of the porous body which consists of irregularly arranged, intertwined metal fibers. However, deep a penetration of cast material into the porous body is prevented by a barrier arranged in the peripheral zone of the porous body. The casting process itself is a pressure casting/injection-molding process or a transfer molding process.

It further has been known from publication DE 10 2013 109 260 A1 to fabricate entire housing components, for example housing walls, housing tops or housing bottoms from a porous material that is formed by irregularly intertwined fibers.

Larger housings of the "flame-proof encapsulation" construction type may be configured as cast aluminum housings. Such housings are intended for a broad spectrum of use so high standards are required for operating temperature ranges. Gaps in the housing must not allow a flame transmission at any of the occurring temperatures. It must ensure that flames, sparks or the like cannot move from the interior space of the housing toward the outside into an explosive environment. Therefore, the housing, as well as the pressure relief device, must withstand an explosion pressure.

OBJECTS AND SUMMARY OF THE INVENTION

It is an object of the invention to provide an improved "flame-proof encapsulation" that is suitable for a broad range of operating temperatures.

The subject housing preferably consists of at least two housing components, one of which being a cast part that has a pressure compensation vent. Arranged in the pressure compensation vent is a pressure relief body that has two flat surfaces facing away from each other. One of the flat surfaces is in contract with the environment, while the other flat surface faces the interior space of the housing. The housing component is configured in such a manner that it extends over the pressure relief body on both its flat surfaces and thus forms a macroscopic positive lock. Accordingly, the section of the housing component that extends over the pressure relief body preferably is uninterrupted along the entire periphery of the pressure relief body. In addition, there is provided a microscopic positive locking fit, in that—during the manufacture of the housing—liquid housing material comes into intimate contact with the rough or porous surface of the pressure relief body and also penetrates the pores to some extent. As a result of this, the seal of the edge of the pressure relief body is ensured.

By applying this concept, it is possible to arrange large-surface pressure relief bodies in the housing components of large-volume housings that have an interior volume of a few liters, even an interior volume of a few tens of liters. This results in a safe mounting of the pressure relief body in the housing component and allows a reduction of the thickness of the housing wall and a determination of the wall thickness thereof, i.e., independent of the thickness of the pressure relief body, which can be utilized for saving material and weight. Furthermore, the mechanically safe and, at the same time, flame-arresting installation even of very large-surface pressure relief bodies in the housings is made possible, such that the housings can be used within a very broad temperature range. This applies also, whenever the cast component is made of a material displaying very high thermal expansion coefficients such as, for example, aluminum, and whenever the pressure relief body displays a thermal expansion coefficient that is clearly different therefrom, such as if it consists of stainless steel. For example, the pressure relief body may consist of several stainless steel fabric layers that have been bonded to each other by a sintering process. In doing so, they form a gas-permeable, rigid body that displays a temperature characteristic different from that of the cast aluminum component.

The cast part that consists of aluminum may be a cast component produced by gravity casting, in particular, sand casting. In doing so, a positive-locking connection is formed between the cast component and the pressure relief body.

Preferably, the materials for the housing component and the pressure relief body are selected such that the melting temperature of the material of the housing component is lower than the melting temperature of the pressure relief body, in which case the liquid material of the housing component does not display any or only minimal wetting tendency relative to the material, in particular the surface of the pressure relief body. The term "surface" in this case is understood to mean the exterior, visible surface, as well as the wire surface of the interior of the body, i.e., the surface of the pores. To do so, oxide layers or other passivation layers existing on the flat surfaces of the pressure relief body are not removed. Preferably, the contact angle between the housing material and the material of the pressure relief body is at least $90°$ ($=\pi/2$), preferably greater than $150°$. Preferably, there will not occur any wetting of the surface of the pressure relief body with the liquid wall material (e.g., aluminum) during the casting process, so that the pores are not filled due to capillary action. Likewise—at least not on the flat surfaces, or also at least not largely overall—there will be no formation of a solder connection, i.e., an alloy zone between the liquid wall material (e.g., aluminum) and the material of the pressure relief body. Consequently, the connection between the pressure relief body and the cast part is strictly positive-locking, i.e., microscopically, as well as macroscopically. Micromovements due to different temperature expansions do not result in the fracture of material or the formation of starting fissures. This ensures the mechanical integrity of the housing, in particular the connection between the housing and the pressure relief body. Dynamic loads, in particular in the event of pressure loads occurring in the housing during an explosion, can thus be withstood by the housing, independent of the housing temperature. Likewise, the only temporary formation and clearance of gaps that would allow a transmission of flame along the periphery of the pressure relief body can be safely precluded. The microscopic and macroscopic meshing between the pressure relief body and the cast component is able to allow microscopic movements due to different thermal expansions of the housing component and the porous body, without impairing the flame arresting capability and without resulting in housing fissures, respectively.

However, it is also possible to allow wetting of the pressure relief body with liquid wall material at some points, e.g., at the peripheral circumferential surface of the pressure-relief body. Being the interface, this may be metallically bright. A solder connection existing here between the housing material and the pressure relief body may not be harmful.

Preferably, the housing comprises two housing components that abut against each other at interfaces that are oriented parallel to the flat surfaces of the pressure relief body. This allows the manufacture of the housing or the housing component in a casting mold for gravity casting, in which case the casting mold must have an exterior form and a core, however, need not comprise movable slides or the like.

Preferably, the pressure relief body is a rigid body that, preferably, consists of several wire mesh layers that are connected to each other by sintering. The individual wire mesh layers preferably comprise warp wires and weft wires that are arranged in plain weave. The individual layers are offset relative to each other and/or twisted in order to define labyrinth-like gas passages. By sintering, the warp and/or weft wires of the individual layers are bonded to each other, so that the sintered body is largely rigid. The resultant elasticity modulus and/or flexural modulus of the pressure relief body can thus differ from the elasticity modulus and/or flexural modulus of the housing wall.

Other objects and advantages of the invention will become apparent upon reading the following detailed description and upon reference to the drawings.

BRIEF DESCRIPTION OF THE DRAWINGS

FIG. 4 is an enlarged sectional view of the interface between the pressure relief body and the housing shown in FIG. 3; and FIG. 5 is a further enlarged detail of the interface shown in FIG. 4.

Figure 1:
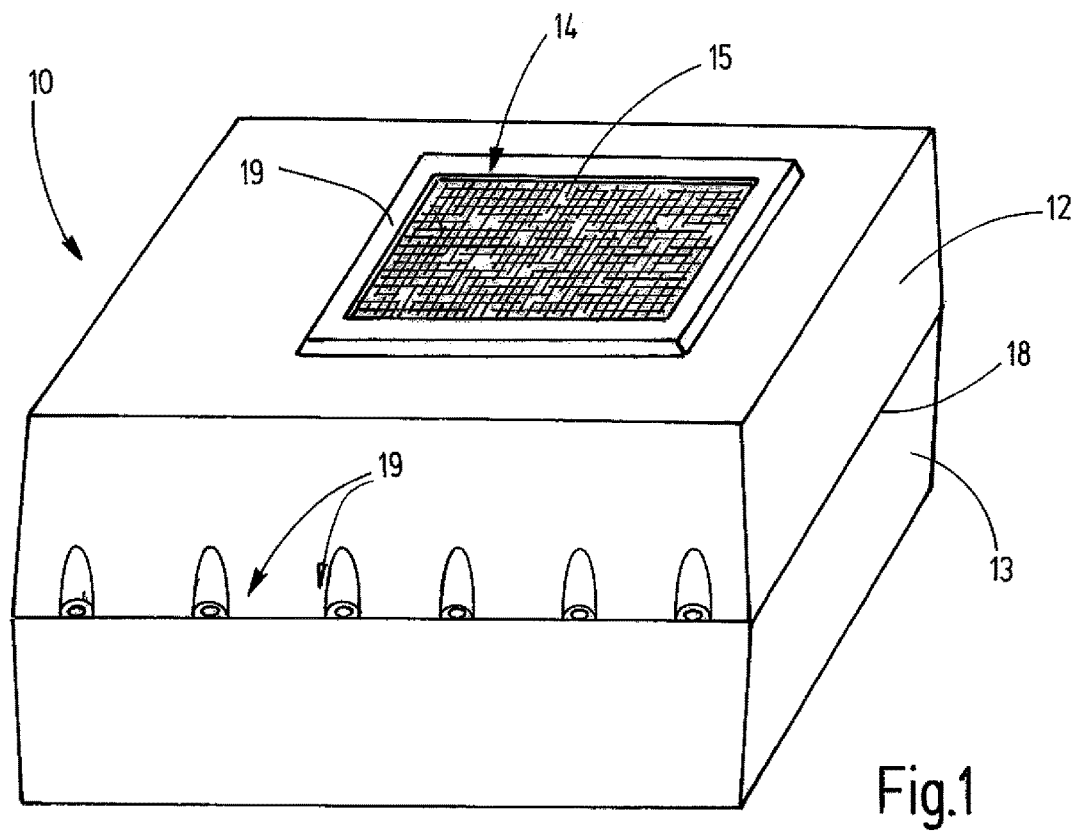
FIG. 1a schematic perspective of a housing according to the invention.

While the invention is susceptible of various modifications and alternative constructions, certain illustrative embodiment thereof has been shown in the drawings and will be described below in detail. It should be understood, however, that there is no intention to limit the invention to the specific form disclosed, but on the contrary, the intention is to cover all modifications, alternative constructions, and equivalents falling within the spirit and scope of the invention.

DETAILED DESCRIPTION OF THE PREFERRED EMBODIMENTS

Referring now more particularly to FIG. 1 of the drawings, there is shown an illustrative explosion-proof housing 10 consistent with the construction of a standardized "pressure-proof encapsulation" (ex-d). The housing 11 encloses an interior space 11, in which electrical and/or electronic parts or components may be arranged, which parts or components may represent ignition sources for an explosive gas mixture existing outside the housing The housing 11 comprises at least two housing components 12, 13 that enclose the interior space 11. At least one of the two housing components 12, 13 has a pressure compensation vent 14 in which a pressure relief body 15 is arranged. Preferably, the latter is a plate-shaped, planar sintered body having a first flat outer surface 16 facing outside and a second flat inner surface 17 facing the interior space 11. Both flat surfaces 16, 17, respectively, preferably take up the entire area of the pressure compensation vent 14 and have openings of flame-arresting channels on the entire surface, said channels extending through the pressure relief body 15. Preferably, the pressure relief body 15 is formed by flat layers of a metal fabric that are welded together or bonded together by sintering. Preferably, the metal fabric is made of stainless steel wires.

Figure 2:
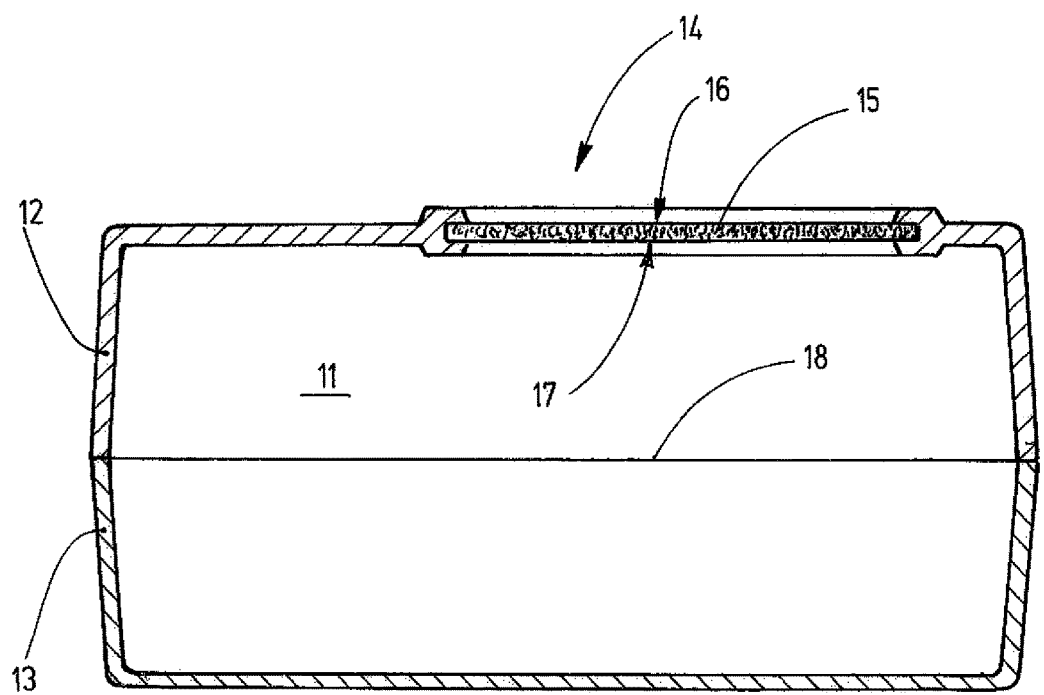
FIG. 2a simplified longitudinal section of the housing shown in FIG. 1.

As illustrated in FIGS. 1 and 2, the housing component 12 may comprise only the one pressure relief body 15 or also several such pressure relief bodies. Preferably, the pressure relief body 15 is arranged in such a manner that its flat surfaces 16, 17 are arranged parallel to an interface 18, at which the housing components 12, 13 abut against each other and at which they are connected to each other. This may be accomplished by all suitable connecting techniques. In the illustrative embodiment, FIG. 1 depicts screw connections 19. Alternatively or additionally, the housing halves 12, 13 may be glued to each other, welded together or clamped together.

The housing component 13 may be configured similar to or equal to the housing component 12. The housing component 13, furthermore, may contain one or more pressure relief bodies that are connected to the housing component 13 in a manner like the pressure relief body 15 is connected to the housing component 12.

Figure 3:
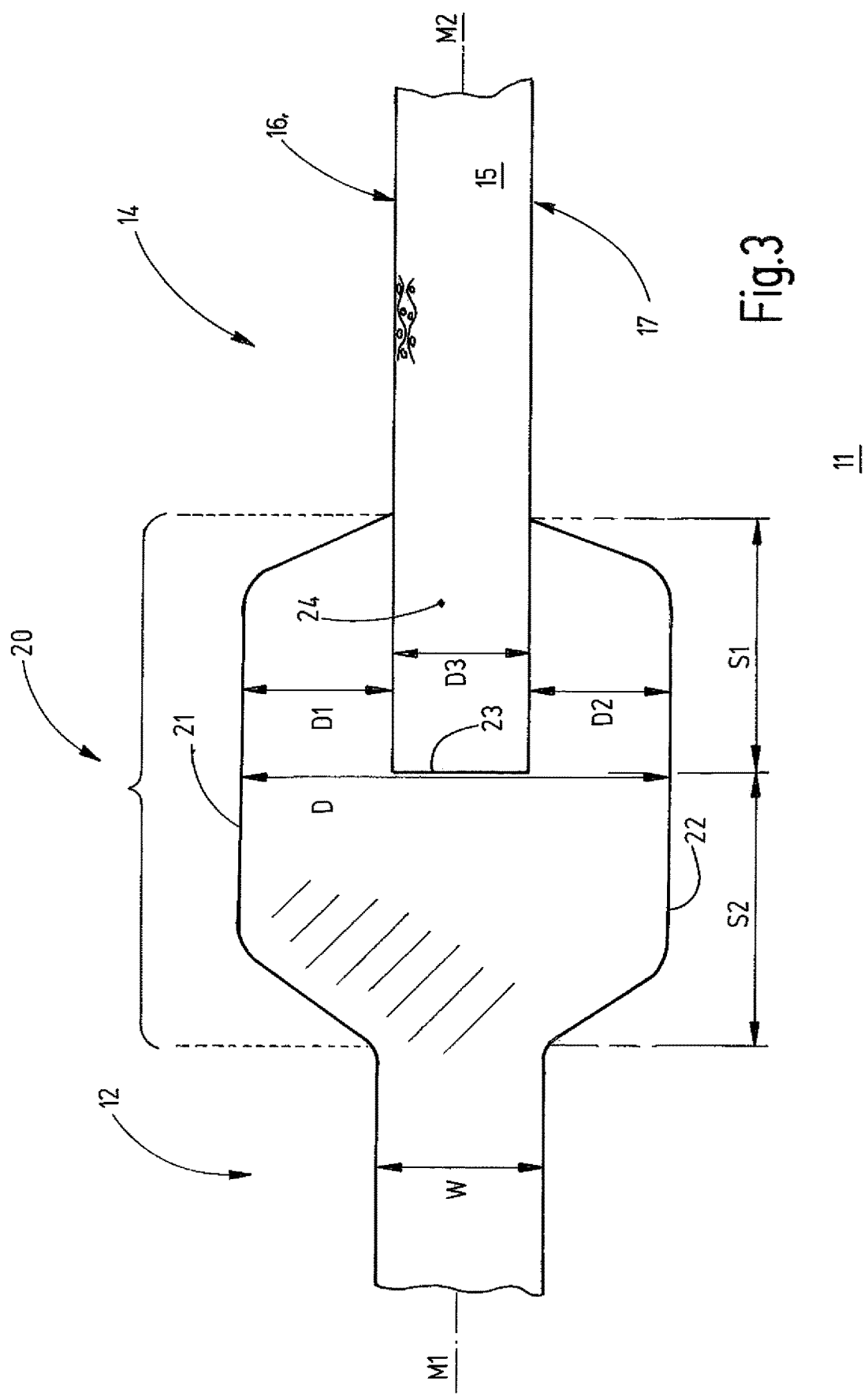
FIG. 3 is an enlarged detailed representation of the housing shown in FIG. 2 illustrating the interface between a pressure relief body thereof and the housing.

In carrying out this embodiment, the pressure relief body 15 and the housing component 12 have a connection as depicted in by FIG. 3. The housing component 12 is a cast part of plastic or metal, preferably, a cast aluminum part that has been produced by a gravity casting process, for example by a sand casting process. The housing component has a wall thickness W that is preferably greater than 7 mm and encloses an interior space having a size of approximately one liter. The housing wall may have a uniform thickness or be provided with ribs or other stiffening projections. In doing so, the wall thickness W should be measured outside a thicker portion 20 surrounding the pressure compensation vent 14. The thicker portion 20 has an outer surface 21 that is preferably flat in at least some sections and a surface 22 that faces the interior space 11 and also is preferably flat in at least some sections, between which surfaces the thickness D of thicker portion 20 is to be measured. In particular, the thickness D, as depicted by FIG. 3, should be measured in the immediate vicinity of a circumferential surface 23 of the pressure relief body 15, which connects the flat outer surface 16 to the flat inner surface 17. For example, it is formed by an interface at which the pressure relief body 15 has been separated out of a larger material assembly. The circumferential surface 23, like the flat surface 16 and the flat surface 17 may have open pores.

A peripheral zone 24 of the pressure relief body 15 is embedded in the thicker portion 20 and held therein. In doing so, a center plane M1 located centered between the flat surfaces of the housing wall is located, for example, on the same level as a center plane M2 that is assumed as being centered between the flat surfaces 16, 17 of the pressure relief body 15. In this case, the center planes M1, M2 form a common plane. However, it is also possible to offset the two center planes M1, M2 with respect to each other so that the thicker portion 20 is asymmetrically formed relative to the center plane M1, and/or the pressure relief body 15 is arranged off-center with respect to the housing wall. In doing so, the preferred direction of pressure stress can be taken into account, for example in that the thicker portion 20 has, on its exterior surface 21, a thickness D1 that is greater than the thickness D2 of the thicker portion 20 on its interior surface, respectively measured at the peripheral zone 24. However, in the embodiment depicted by FIG. 3, the thicknesses D1 and D2 are the same.

The thicker portion 20 extends over the peripheral zone 24 of the pressure relief body 15 over a distance S1 that is preferably greater than at least 5 mm. This distance S1 defines the width of the peripheral zone 24 embedded in the thicker portion 20. Extending from the circumferential surface 23 of the pressure relief body 15 up to the portion of decreased thickness of the housing wall, there extends the thicker portion 20 over a distance S2. The latter is preferably as great as or also less than the distance S1.

The thickness D1 and/or the thickness D2 of the respectively thicker portion is preferably at least 4 mm. The thickness D3 of the pressure relief body 15 to be measured between the two flat surfaces 16, 17 may preferably be within the range of 2 to 10 mm.

FIG. 4 shows the connection between the peripheral zone 24 and the housing material, in a partially simplified representation. As can be seen, the housing material is in intimate contact—on the flat surface 16 (and accordingly, 17), as well as on the circumferential surface 23—with the pressure relief body 15, without penetrating deeply into the pressure relief body. However, microtoothing forms between the housing material and the wires of the pressure relief body 15, i.e., a micro-interlock.

The melting temperature of the material of the housing component 12 is lower than the melting temperature of the pressure relief body 15. The liquid material of the housing component 12 displays no or only minimal wetting tendency relative to the material of the pressure relief body 15. For example, this is achieved by the material pairing of stainless steel (for the pressure relief body 15) and the aluminum alloy (for the housing component 12). The contact angle α shown in FIG. 5 is preferably greater than 90°, further preferably greater than 120°, 150°, or 160°. To a large extent, there is no formation of alloy zones and solder connections between the housing component 12 and the pressure relief body. Therefore, microscopic relative movements are possible without the formation of high local shearing stress in the structure of the housing component 12 at the contact surface between the housing component 12 and the pressure relief body 15. There is no formation of micro-fissures in the structure of the housing component, which could otherwise lead to the start of cracks and permanently compromise the mechanical load bearing capacity of the housing, as well as the pressure pulse strength.

With the situations as described, the housing component 12 is stable and can be safely used within a wide temperature range of, for example, −60° C. to +80° C. An explosion triggered in the interior space 11 remains confined to the interior space 11. Independent of whether or not a temperature-related tensile or compressive stress prevails on the connecting site between the pressure relief body 15 and the thicker portion 20 of the housing component 12, corresponding shock loads do not result in an opening of joins or in gaps, through which flames or burning particles could pass.

During the manufacture of the housing component 12, the pressure relief body 15 is placed into the gravure of a casting mold, and then the mold core is placed on the pressure relief body 15. During the subsequent filling of liquid housing material, in particular metal, for example aluminum or an aluminum alloy, this material fills the gap between the mold core and the casting mold and thus forms the housing component 12, including the thicker portion 20. In it, the liquid housing material flows around the peripheral zone 24 of the pressure relief body 15, in which case said housing material superficially penetrates into the openings of the pressure relief body 15. As a result of this, a microtoothing occurs. If the pressure relief body 15 consists of stainless steel wire and if the material of the housing component 12 is aluminum or an aluminum alloy, there will occur—typically at most at some points or not at all—a wetting between the pressure relief body 15 and the liquid metal of the housing component 12. As a result of this, the surface tension of the liquid molding material prevents a deeper penetration of the housing wall material into the pressure relief body 15. Consequently, this prevents—even in large housings that require a considerable cooling time—that the pressure relief body 15 is filled with liquid metal due to capillary effects and thus constricted or closed. Rather, the pores of the pressure relief body 15 remain free of aluminum or other housing material even in the peripheral zone 24.

The housing 10 according to the invention comprises at least one pressure relief body 15 that is arranged in a pressure compensation vent 14 of one of the housing components 12, 13. For mounting the pressure relief body 15 in or on the housing component 12, a thicker portion 20 is provided, which portion extends over the peripheral zone of the pressure relief body 15 along the entire circumferential surface 23 of the pressure relief body 15 on both flat surfaces 16, 17 of the pressure relief body 15. The resultant embedding depth S1 that is to be measured parallel to the flat surfaces 16, 17 is preferably greater than the thickness D1, D2 of the part of the thicker portion 20 extending over the peripheral zone 24. The pressure relief body 15 consists of sintered wire mesh. By bundling these measures, a microscopic, as well as macroscopic, positive-locking connection is achieved between the pressure relief body 15 and the housing component 12. This connection displays long-term stability within a wide temperature range and is pressure-resistant.

| List of Reference Signs: | |
|---|---|
| 10 | Housing |
| 11 | Interior space |
| 12, 13 | Housing components |
| 14 | Pressure compensation vent |
| 15 | Pressure relief body |
| 16 | Flat outer surface of pressure relief body 15 |
| 17 | Flat inner surface of pressure relief body 15 |
| 18 | Interface |
| W | Thickness of the wall of housing part 12 |
| 19 | Screw connections |
| 20 | Thicker portion around pressure compensation vent 14 |
| 21 | Outer surface of thicker portion 20 |
| 22 | Inner surface of thicker portion 20 |
| D | Thickness of thicker portion 20 |
| 23 | Circumferential surface of pressure relief body 15 |
| M1 | Center plane of the wall of the housing |
| M2 | Center plane of pressure relief body 15 |
| 24 | Peripheral zone of pressure relief body 15 |
| D1, D2 | Thickness of thicker portion 20 |

-continued

| | List of Reference Signs: | |
|---|---|---|
| S1 | Depth of the embedding of pressure relief body 15 in housing component 12 (i.e., distance how deep pressure relief body 15 extends into housing component 12) | |

The invention claimed is:

1. An explosion-proof housing (10) for providing a pressure proof encapsulation comprising:
 at least two housing components (12, 13) that in a joined condition enclose an interior space (11) in which electrical components that potentially form ignition sources can be accommodated,
 at least one of the housing components (12, 13) being a cast part having a pressure compensation vent (14),
 at least one pressure relief body (15) with two flat surfaces (16, 17) arrange in the pressure compensating vent (14) and connected to the cast part,
 said cast part being formed so as to at least partially extend over the pressure relief body (15) onto the flat surfaces (16, 17) thereof, and
 said housing component (12) with said pressure compensating vent (14) and pressure relief body (15) having a melting temperature that is lower than the melting temperature of the pressure relief body (15).

2. The explosion-proof housing (10) of claim 1 in which the housing component (12) with the pressure relief body (15) is a metal cast part.

3. The explosion-proof housing (10) of claim 2 in which the housing component (12) with the pressure relief body (15) is made of aluminum.

4. The explosion-proof housing (10) of claim 1 in which the two housing components (12, 13) are in abutting relation to each other at an interface (18) which is oriented parallel to the flat surfaces (16, 17) of the pressure relief body (15).

5. The explosion-proof housing (10) of claim 1 in which said pressure relief body (15) is a sintered wire mesh body that consists of several wire fabric layers bonded together by sintering.

6. The explosion-proof housing (10) of claim 1 in which the flat surfaces (16, 17) of the pressure relief body (15) are formed so as to be flat at least in sections.

7. The explosion-proof housing (10) of claim 1 in which the pressure relief body (15) and pressure compensation vent (14) have rectangular contours, wherein the contour of the pressure relief body (15) is larger than the contour of the pressure compensation vent (14).

8. The explosion-proof housing (10) of claim 1 in which the pressure relief body (15) has a circumferential surface (23) which extends between the flat surfaces (16, 17) and which is configured as a smooth interface.

9. The explosion-proof housing (10) of claim 8 in which the housing component (12) measured on the circumferential surface (23) of the pressure relief body (15) has a thickness (D) which is greater than the thickness (D3) of the pressure relief body (15).

10. The explosion-proof housing (10) of claim 9 in which the housing component (12) measured on the circumferential surface (23) of the pressure relief body (15) has a thickness (D) which is greater than the wall thickness (W) of the housing component (12) measured at a distance from the pressure compensation vent (14).

11. An explosion-proof housing (10) for providing a pressure a pressure proof encapsulation comprising:
 at least two housing components (12, 13) that in a joined condition enclose an interior space (11) in which electrical components that potentially form ignition sources can be accommodated,
 at least one of the housing components (12, 13) being a cast part having a pressure compensation vent (14),
 at least one pressure relief body (15) with two flat surfaces (16, 17) arrange in the pressure compensating vent (14) and connected to the cast part,
 said cast part being formed so as to at least partially extend over the pressure relief body (15) onto the flat surfaces (16, 17) thereof, and
 said housing component (12) with the pressure compensating vent (14) and pressure relief body (15) being made of a metallic material that does not penetrate the pressure relief body (15) when melted.

\* \* \* \* \*